(12) United States Patent
Reddy et al.

(10) Patent No.: US 7,801,718 B2
(45) Date of Patent: Sep. 21, 2010

(54) ANALYZING TIMING UNCERTAINTY IN MESH-BASED ARCHITECTURES

(75) Inventors: Subodh M. Reddy, San Jose, CA (US); Gustavo R. Wilke, San Jose, CA (US); Rajeev Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 781 days.

(21) Appl. No.: 11/680,020

(22) Filed: Feb. 28, 2007

(65) Prior Publication Data

US 2007/0208552 A1 Sep. 6, 2007

Related U.S. Application Data

(60) Provisional application No. 60/779,242, filed on Mar. 3, 2006.

(51) Int. Cl.
*G06F 17/50* (2006.01)
*G06F 9/45* (2006.01)

(52) U.S. Cl. .......................... 703/14; 716/6
(58) Field of Classification Search .................. 703/13, 703/14; 716/6
See application file for complete search history.

(56) References Cited

U.S. PATENT DOCUMENTS

| 5,313,398 | A | 5/1994 | Rohrer et al. ................. 703/14 |
| 6,807,520 | B1 | 10/2004 | Zhou et al. .................... 703/14 |
| 6,978,229 | B1 | 12/2005 | Saxena et al. .................. 703/4 |
| 7,000,205 | B2 | 2/2006 | Devgan et al. ................. 716/6 |
| 2007/0038430 | A1* | 2/2007 | Walker et al. ................. 703/14 |
| 2007/0203681 | A1* | 8/2007 | Eyvazzadeh et al. .......... 703/10 |

OTHER PUBLICATIONS

Robert B. Hitchcock (Timing verification and the timing analysis program, 1982).*
Walker et al. (U.S. Appl. No. 60/697,110) teaches a sliding window scheme for accurate clock mesh analysis, Jul. 6, 2005.*
W.T. Beyene, "Efficient Simulation of Chip-to-Chip Interconnect System by Combining Waveform Relaxation with Reduced-Order Modeling Methods," Electronic Components and Technology Conference, IEEE 0-7803-7430-4/02, 6 pages, 2002.

(Continued)

*Primary Examiner*—Paul L Rodriguez
*Assistant Examiner*—Andre Pierre Louis
(74) *Attorney, Agent, or Firm*—Baker Botts L.L.P.

(57) ABSTRACT

A method of analyzing timing uncertainty involves creating an accurate model of one or more circuit elements of a mesh circuit residing within a window that covers a subset of the mesh circuit. An approximate model of one or more circuit elements of the mesh circuit residing outside of the window is also created. Monte Carlo simulations are performed on the combination of the accurate model and the approximate model to determine a plurality of timing values, wherein each run of the Monte Carlo simulation varies one or more parameters potentially affecting the operation of the mesh circuit. An uncertainty associated with the circuit elements is determined, based at least in part on the plurality of timing values. One embodiment considers clock as the signal whose timing uncertainty can be determined. Other embodiments model and simulate the global drive circuit that drives the mesh circuit separately from the mesh circuit to take into account common path correlations in the drive circuit.

54 Claims, 4 Drawing Sheets

OTHER PUBLICATIONS

S. Barmada et al., "Efficient method to treat parameters' uncertainties in complex circuits," PD5-1, IEEE 1-4244-0320-0/06, 1 page, © 2006.

EPO, Extended European Search Report and Communication, 07103313.8-2224, 5 pages, Jul. 20, 2007.

* cited by examiner

COMPLETE MESH

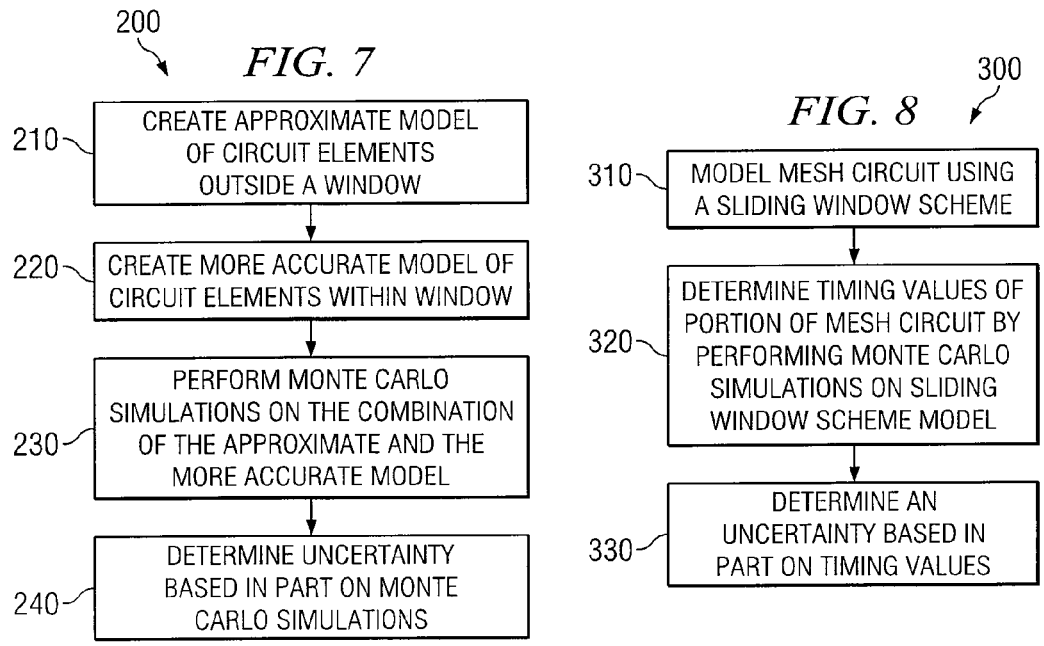
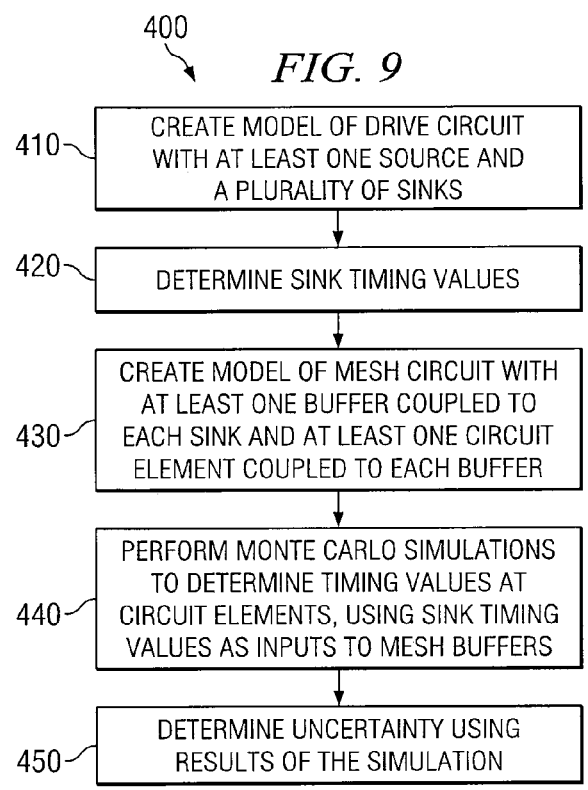

US 7,801,718 B2

ANALYZING TIMING UNCERTAINTY IN MESH-BASED ARCHITECTURES

RELATED APPLICATIONS

This application claims priority to U.S. Provisional Patent Application Ser. No. 60/779,242, filed Mar. 3, 2006, entitled "Analyzing Timing Uncertainty in Mesh-Based Clock Architectures."

TECHNICAL FIELD OF THE INVENTION

This invention relates in general to digital circuits, and more particularly to analyzing timing uncertainty.

OVERVIEW

Designers of digital circuits often use mesh architectures to distribute global signals on a chip, such as clock and power/ground. Mesh architectures can be difficult to analyze and, furthermore, variations can cause uncertainty in the delay from the clock source to various circuit elements.

SUMMARY OF EXAMPLE EMBODIMENTS

In accordance with various embodiments of the present disclosure, several disadvantages and problems associated with analyzing uncertainty in mesh circuits have been substantially reduced or eliminated. In particular, large design and mesh instances can be quickly and accurately analyzed using the described embodiments.

In accordance with one embodiment of the present disclosure, a method comprises creating an accurate model of one or more circuit elements of a mesh circuit, the model residing within a window that covers a subset of the mesh circuit. The method further comprises creating an approximate model of one or more circuit elements of the mesh circuit residing outside of the window. The method performs a plurality of Monte Carlo simulations of the mesh circuit represented by the combination of the accurate model of one or more circuit elements residing within the window and the approximate model of one or more circuit elements residing outside the window. Additionally, the method determines an uncertainty, associated with at least a portion of the mesh circuit based at least in part on results obtained from the plurality of Monte Carlo simulations of the mesh circuit.

In accordance with another embodiment of the present disclosure, a method of determining a timing value uncertainty associated with at least a portion of a mesh circuit includes modeling a mesh circuit using a sliding window scheme. The method determines a plurality of timing values associated with the at least a portion of the mesh circuit, by performing a plurality of Monte Carlo simulations on the sliding window scheme model of the mesh circuit. In addition, the method determines a timing value uncertainty, associated with the at least a portion of the mesh circuit based at least in part on the plurality of timing values.

In accordance with another embodiment, a method analyzes the global clock tree to create a delay distribution at the tree sinks. The method uses this distribution to create inputs for a Monte Carlo run of the mesh analysis. The method determines a plurality of timing values associated with at least a portion of the mesh circuit, and computes a timing value uncertainty based at least in part on the plurality of timing values.

In another embodiment, a method of determining a timing value uncertainty associated with at least a portion of a circuit that includes a drive circuit driving a mesh circuit comprises creating a model of a drive circuit comprising at least one source and a plurality of sinks. The method includes computing a set of sink timing values for a drive signal arriving at the respective drive circuit sink by using variations of one or more parameters potentially affecting the model of the drive circuit. The method further includes creating a model of a mesh circuit driven by the drive circuit, wherein the mesh circuit comprises at least one mesh buffer coupled to each of the plurality of drive circuit sinks and one or more circuit elements coupled to each of the mesh buffers. The method performs a plurality of Monte Carlo simulations on the model of the mesh circuit to determine, for each simulation, a circuit element timing value of a drive signal at each of the respective circuit elements. The sink timing values of the drive circuit are used in at least one of the plurality of simulations of the mesh circuit as inputs to the mesh buffers coupled to the respective drive circuit sinks. The method further comprises determining a timing value uncertainty associated with at least some of the one or more circuit elements based at least in part on the results of the simulations of the model of the mesh circuit.

Depending on the specific features implemented, particular embodiments of the present disclosure may exhibit some, none, or all of the following technical advantages. These methods can analyze large designs at faster speeds and with lower memory use than existing methods. At least some of these embodiments can also analyze timing uncertainty in the presence of parameter variations.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and various advantages, reference is now made to the following description, taken in conjunction with the accompanying drawings, in which:

FIG. 7 is a flowchart illustrating one example of a method for analyzing timing uncertainty using a sliding window scheme analysis.

FIG. 8 is a flowchart illustrating another example of a method for analyzing timing uncertainty.

FIG. 9 is a flowchart illustrating an example of a method for analyzing timing uncertainty associated with a tree circuit that drives a mesh circuit.

DETAILED DESCRIPTION

Mesh or grid architectures are popular for distributing critical global signals on a chip, such as clock and power/ground. The mesh architecture often uses inherent redundancy created by loops to smooth out undesirable variations between signal nodes distributed across the chip. These variations can arise, for example, due to switching activity in the design, within-die process variations, or asymmetric distribution of circuit elements. For power/ground signals, a mesh architecture can reduce voltage variations at different nodes in the network.

One issue that has limited the applicability of mesh architectures is the difficulty in analyzing them accurately. Among the contributing factors for this are the huge numbers of circuit nodes needed to accurately model a fine mesh in a large design and the large number of metal loops in the mesh structure. As a result, simulations can entail an inordinate amount of memory and/or a long run-time.

Variations in parameters that affect clock latency bring forth an added degree of complications, that is, the time delay between the initiation of the clock signal and its intended effect. These parameters include, but are not limited to, process characteristics (such as channel length, oxide thickness, interconnect width and thickness, etc.), supply voltage, temperature, and crosstalk noise. Variations in these parameters can cause variations or uncertainty in the delay from the clock root to the circuit elements. With technology scaling, the magnitude of parameter variations and the sensitivity of clock latency towards variations are increasing.

Figure 1:
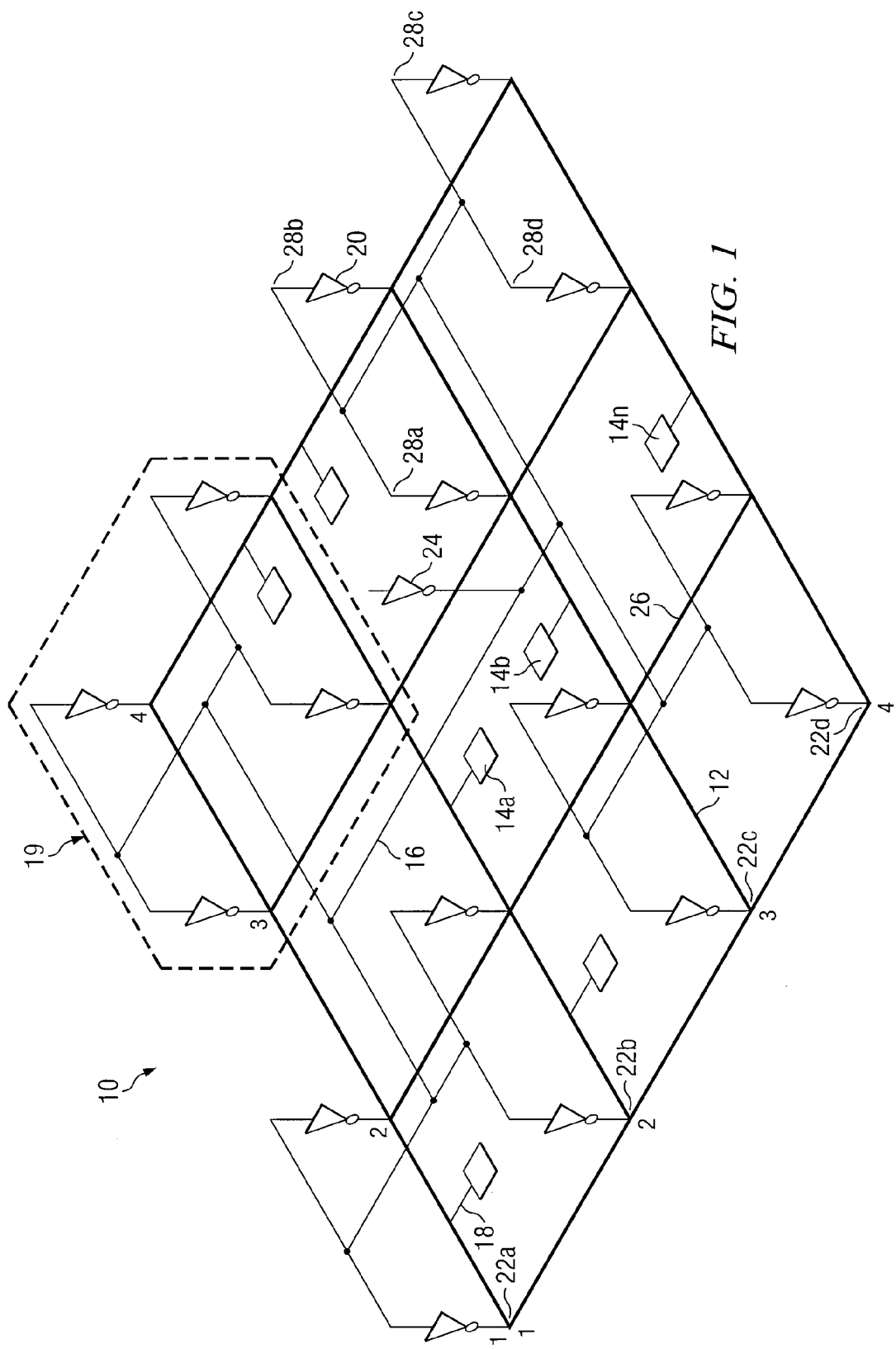
FIG. 1 illustrates one example of a mesh-based clock architecture.

FIG. 1 illustrates an example of a mesh architecture 10 used for distributing the clock signal from the phase-locked loop (PLL) or clock driver to circuit elements 14a-14n (such as flip-flops (FFs)) and latches on the chip. Mesh architectures of other shapes and sizes are also possible, as are mesh architectures with other types of circuit elements. The architecture in FIG. 1 includes a uniform mesh 12, a global buffered tree 16 that drives the mesh 12, and local interconnect 18, which connects the clock inputs of circuit elements to the nearest point on the mesh. The mesh architecture 10 in this example comprises a uniform rectangular grid of mesh segments 26 spanning the entire chip area, driven by the mesh buffers 20 and propagating the clock to the circuit elements 14a-14n. Mesh nodes 22a-22n are the points where rows and columns connect. For simplicity of the drawing, only mesh nodes 22a-22d are labeled in FIG. 1. As shown in FIG. 1, the global (H–) tree 16 delivers the clock signal from the clock driver 24 to the mesh nodes 22a-22n via mesh buffers 20. Mesh buffers may not be at every mesh node in other embodiments. The mesh wire between two adjacent mesh nodes are mesh segments 26, and each represents one grid unit.

This disclosure provides several methods of analyzing uncertainty associated with mesh circuits. In one embodiment, an approximate model can be created of one or more circuit elements (e.g., buffers 20, mesh segments 26, flip flops 14a-14n) that reside outside of a window 19 covering a portion of the mesh circuit. In addition, a more accurate model can be created for one or more circuit elements residing within window 19. A plurality of simulations, for example Monte Carlo simulations, can be performed on all or a portion of the mesh circuit represented by the combination of the approximately modeled circuit elements residing outside the window 19 and the more accurately modeled circuit elements residing within window 19. Based on these simulations, an uncertainty can be determined for at least the portion of the mesh circuit being modeled. In some instances, various parameter values associated with certain circuit elements being modeled (both inside and outside the window) can be specified and/or varied during this analysis.

In one particular embodiment, a sliding window scheme (SWS) can be used to determine uncertainty. For example, window 19 may reside in one position relative to the entire mesh circuit, during a first portion of the analysis. During this portion, simulations, such as Monte Carlo simulations, can be used while the window is in the first position to determine a timing value associated with the mesh circuit and that window position. The window can then be moved to another position relative to mesh circuit 10 to facilitate calculation of another timing value associated with that window position. By repeatedly moving window 19 to different positions relative to mesh circuit 10, a plurality of timing values for the mesh circuit can be calculated, and an uncertainty for mesh circuit 10 can be determined, using those timing values.

In another embodiment, the uncertainty analysis can account for the presence and operation of tree circuit 16. For example, a model of tree circuit 16 can be created, which accounts for multiple sources (like clock driver 24) and multiple sinks 28a-28n in the tree circuit (for simplicity, only sinks 28a-28d are labeled in FIG. 1). Simulations, such as Monte Carlo simulations, can be performed on the model of tree circuit 16 to determine, for example, sink timing values (e.g., arrival times or other values) for drive signals arriving at each tree sink 28a-28n being simulated. In conjunction with this effort, a model of all or a portion of mesh circuit 10 that is driven by tree circuit 16 can be created. Monte Carlo simulations of the mesh circuit can be performed, and these simulations can take as an input one or more sink arrival times determined based on the simulations of tree circuit 16. Using this approach, an uncertainty for all or a portion of mesh circuit 10 can be determined that accounts for the effects of tree circuit 16. In various embodiments, tree circuit 16 can be used to drive one mesh circuit or a plurality of mesh circuits.

Figure 2:
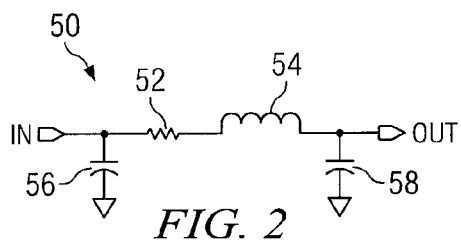
FIG. 2 illustrates one example of a single-π model for a wire.
Figure 3:
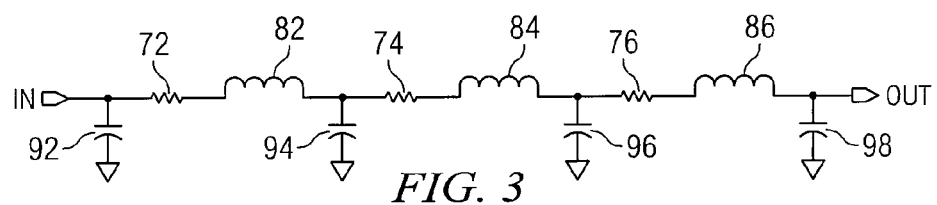
FIG. 3 illustrates another example of a 3-π model for a wire.

The clock network can be modeled in a variety of ways. In one embodiment, the method models each mesh buffer 20 using the BSIM3 transistor models for NMOS and PMOS. The mesh is largely composed of mesh segments 26, so an accurate wire model also can be a component of the mesh model. To improve the run-time and the size of the simulation model, smaller wires can be modeled differently than larger wires. FIG. 2 shows single-π model 50, which can be used, for example, to model wires smaller than 100 microns. This single-π model 50 uses resistor 52, inductor 54, and capacitors 56 and 58 to model the wire. FIG. 3 illustrates model 70, known as a 3-π model, which can be used, for example, to model longer wires. 3-π model 70 includes resistors 72, 74, and 76; inductors 82, 84, and 86; and capacitors 92, 94, 96, and 98. In this example, the method models the clock pins of the circuit elements 14 in FIG. 1 as an equivalent capacitance.

One point of interest in many clock distribution schemes is the accurate computation of the clock latency at the clock input pin of each circuit element 14. The difference in clock arrival times at two different circuit elements is known as the skew between those elements. By comparing multiple arrival times, the worst skew in the design can be calculated. The more significant skew limits the maximum delay in the data path, and has a direct impact on the design turnaround time. Alternatively, for a given design, the skew impacts the maximum clock frequency for which the clock will function correctly.

At a given circuit element on a chip, two consecutive clock edges may not be one expected time unit apart. Clock timing uncertainty denotes the deviation of the timing of the clock edge from its expected value. Several factors can cause this uncertainty, detailed below.

1. Supply Noise V: this is caused by different sets of gates switching in different clock cycles. Gate delay depends on the value of supply voltage, and any change in the supply voltage of a clock buffer changes the clock arrival time at the circuit element.

2. Temperature Variation T: Temperature varies due to switching activity on the chip. Higher switching activity results in higher power dissipation, leading to higher temperatures. A gate operating at a higher temperature exhibits higher delay due to reduced carrier mobility.

3. Process Variations (within die and die-to-die) P: examples of process variations include intrinsic variations such as random dopant fluctuations in a MOSFET channel and extrinsic variations such as channel length and oxide thickness variations. In a chemical mechanical planarization (CMP) process, interconnect width and thickness may vary significantly from the intended values. These variations cause gate and wire delays to deviate from their desired values.

4. Crosstalk Noise X: delay of a clock wire can change if there is an aggressor that is physically close to the clock wire and is switching. This switching behavior can lead to timing variations on the clock wire. Designers typically shield both sides of the clock to reduce or eliminate such crosstalk impact; however, this does not prevent crosstalk from the top and bottom layers.

5. PLL Jitter: Clock generated from the PLL has an inherent jitter.

Some of the above parameters have random unknown variation components that are fixed once the chip is manufactured. Other parameter variations, like supply and crosstalk noise, have to be computed for each clock cycle. Their exact computation typically requires prohibitive CPU and memory resources and may be infeasible in practice. However, both kinds cause uncertainty in the timing of the clock edge at a circuit element 14 from its expected value.

If D denotes the path delay from the clock root to a circuit element, then we can model D as a function of V, T, P, and X. Uncertainty in D is denoted as U(D).

Figure 4:
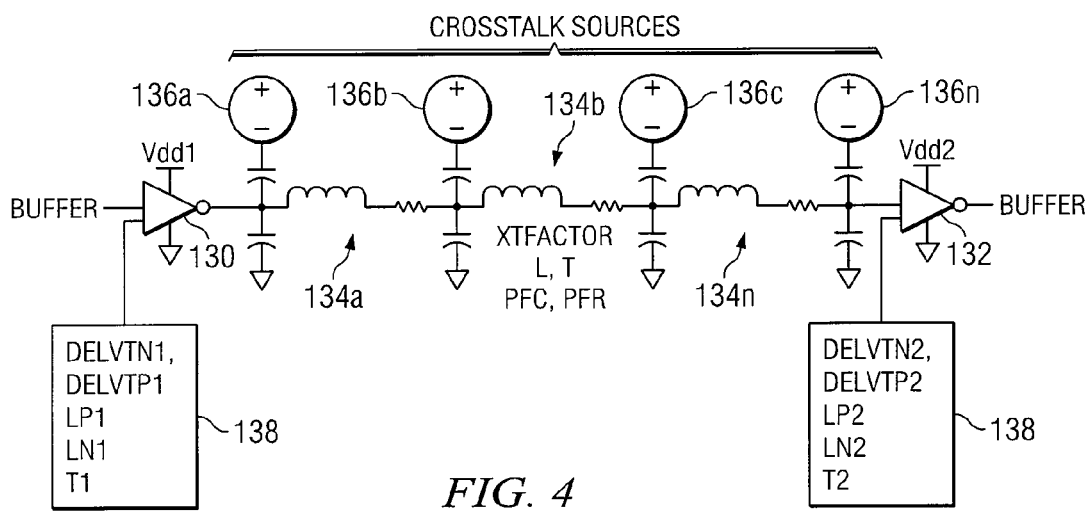
FIG. 4 illustrates one example of a statistical simulation model for a buffer driving another buffer through a wire.

FIG. 4 shows one embodiment of a statistical simulation model for a buffer driving another buffer through a wire. In the figure, inverting buffer 130 drives inverting buffer 132 through a wire. In this example, supply noise V is modeled by supplying independent power supplies $V_{dd1}$ and $V_{dd2}$ to each clock buffer, and allowing them to vary randomly according to a noise model. Temperature variation T is modeled by specifying an underlying temperature for the entire chip and then applying random local temperature variations on each clock buffer and each interconnect. Process variation P of transistors can be modeled using, for example, channel length L ($l_p$ and $l_n$) and/or threshold voltages $delvt_n$ and $delvt_p$. Other variations have the effect of varying the threshold voltage, and thus are indirectly included when modeled in this manner. The transistor variables are collectively labeled 138 in the figure. The variations of threshold voltages $delvt_n$ and $delvt_p$ and channel length L are passed into each instance of the inverting buffer 130 and 132 sub-circuit models. Process variation of wiring is modeled by applying random process factors $pf_c$ and $pf_r$ to the wiring capacitance and resistance in the wire models 134a-134n.

Crosstalk noise in FIG. 4 is modeled by modeling the presence of external noise sources 136a-136n coupled to the wire model and by applying random inputs at these sources based on some probability distribution. For PLL jitter, a maximum jitter of $3\sigma$ is assumed for analysis.

If the clock network is a tree, uncertainty analysis can be performed, for example, using gate-level statistical static timing analysis. Such an approach, however, may not be directly applicable for a mesh-based clock network due to metal loops present in the mesh. One possible solution is to run Monte Carlo simulations on the mesh model, if it can be fit into memory. Monte Carlo simulations assume some distribution for parameter variations and obtain a delay distribution at each circuit element, from which timing uncertainties at the elements can be derived. The parameters of each circuit element can be set independently of the parameters of other circuit elements during each Monte Carlo simulation. Some techniques include a scheme to break the clock mesh into a tree and apply a smoothing algorithm to redistribute the mesh loads.

Figure 5:
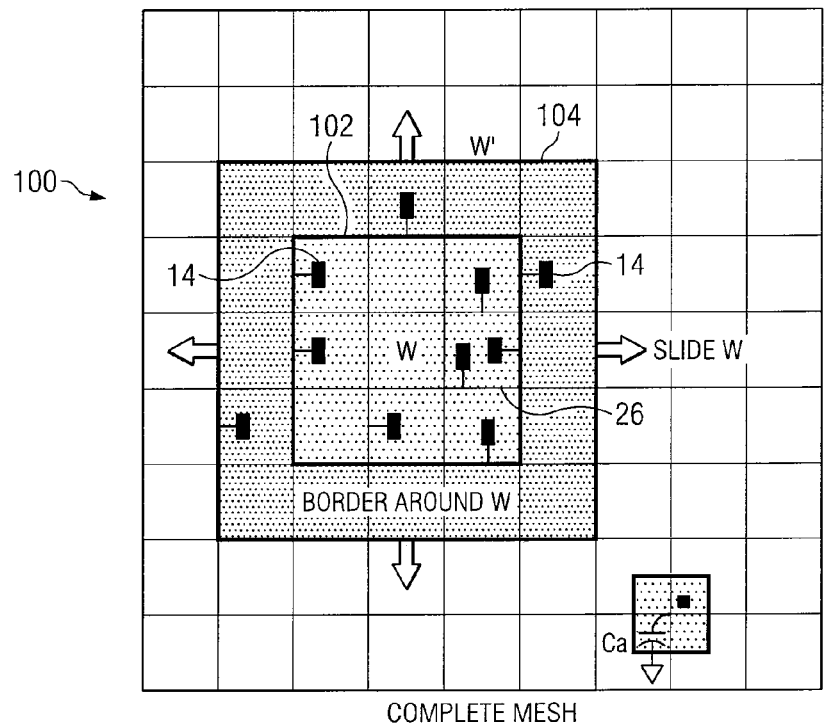
FIG. 5 illustrates one example of a sliding window scheme.

One embodiment of this disclosure uses a sliding window scheme (SWS) for latency analysis of clock meshes. In SWS, the mesh is modeled with at least two different resolutions: a detailed circuit elements model for mesh elements close to the nodes whose latency is being measured, and a simplified model for mesh elements farther from the nodes being measured. FIG. 5 shows an example of a model of a complete mesh 100. SWS uses a rectangular inner window 102 (W) smaller than the complete mesh 100. This window also has a border 104 of one or more grid units (W'). The method accurately models the connection of a circuit element 14 within border 104 to the nearest mesh segment 26. In one particular embodiment, circuit elements within border 104 are each modeled individually. A single-$\pi$ or 3-$\pi$ model can be used to model the mesh segment, as shown in FIGS. 2 and 3. The method models the clock input pin of the circuit element 14 as a capacitance. Circuit elements that lie outside border 104 and their connections to the mesh are modeled approximately. For example, clock input pin capacitances can be lumped together and treated as one at a given mesh node outside border 104. Appropriate $\pi$ models are used to model mesh segments outside border 104. Finally, the method measures clock latencies at all the circuit elements within the inner window 102.

After performing the model analysis at one window position, the method slides the inner window 102 horizontally or vertically so as not to overlap with the previous inner window location. A model is again created and run using simulation software. Thus, the method breaks down the entire mesh into multiple independent window-based simulations. SWS is thus a divide-and-conquer partitioning technique.

SWS can approximate the region outside the border 104 to reduce the number of nodes in the circuit model. In this embodiment, the latencies computed using SWS with a border 104 of one grid unit were generally within 1% of the latencies computed from SPICE simulations of the entire mesh. Using no border yielded less accurate results; errors of up to 30% can be seen. Increasing the border 104 beyond one grid unit does not improve accuracy much, but significantly increases runtime. It is believed that as window size increases, more accurate results can be obtained by using larger border sizes.

SWS can now be used to analyze timing uncertainty of the mesh. Variation parameters are assumed for each buffer and wire on the clock network, as described in FIG. 4. For each window W' of FIG. 5, a model of the mesh is created and the method carries out Monte Carlo simulations. In each run of the Monte Carlo simulation, the values of the V, T, P, and X parameters for each component of the clock network are determined from their respective distributions, and the method computes the delay D of each circuit element. After multiple runs are completed, a distribution of the delay D is available for each circuit element. The method then computes the uncertainty U(D) from this distribution. The method can collect further uncertainties from all windows W' to yield uncertainties at all the circuit elements in the design.

FIG. 1 details a clock mesh that also includes a global tree 16 that drives the mesh 12 through mesh buffers. In another embodiment of this disclosure, SWS-based uncertainty analysis can also handle this clock network. One way to do this is to include the entire tree for each location of the window 102 in SWS-based MCS's. This is time-consuming and memory-intensive, however, since it re-analyzes the same tree for each window 102 location. Another more efficient way to do this is to decouple the tree uncertainty analysis from the mesh analysis and carry the two out separately. This speeds up the analysis and also uses less memory.

Figure 6:
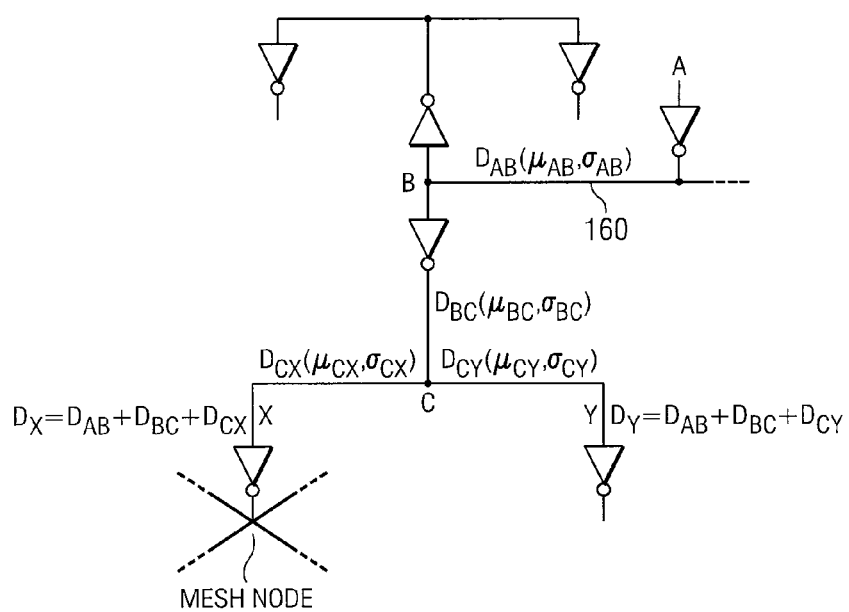
FIG. 6 illustrates one example of a global tree uncertainty analysis.

One embodiment of decoupling the tree and mesh analysis is to first run Monte Carlo simulations on the entire monolithic clock network, with the global tree 16 and mesh 12 together, and measure the uncertainty at each circuit element 14. For purposes of reference, this is referred to as the Golden methodology (G). Next, the method decouples the tree and mesh analyses. In this step, Monte Carlo simulations are performed on the global tree 16, and the mean and standard deviation of the clock arrival time at the input of each mesh buffer 20 are derived. The method uses the mean and standard deviation as inputs to the mesh uncertainty analysis. The mesh uncertainty analysis computes uncertainty at one or more circuit elements. This uncertainty is then compared to G. This method alone, however, can produce less accurate results, because the latency variables at the mesh buffer 20 inputs are not all independent: they are correlated to each other due to tree edges shared between the paths from the clock tree root to the two buffers. FIG. 6, which shows the global tree uncertainty analysis, illustrates this concept.

One method of solving the correlation problem is as follows. The tree uncertainty analysis generates delay distribution for each stage of the global clock tree. For example, in FIG. 6, the method generates a mean ($\mu_{AB}$) and standard deviation ($\sigma_{AB}$) for the delay of edge 160 (AB). For each run of the mesh Monte Carlo simulation, a delay sample for each tree stage can be generated from each stage's delay distribution. The delays of stages on the path in the clock tree are then added to generate latency. The method uses these path latency values as inputs in a particular Monte Carlo run of the mesh analysis. Thus, each edge in the tree contributes the same delay to all the paths it belongs to. The results are much better using this approach; that is, the difference between these results and G is lower than when common path correlations in the tree are not taken into account. The method ignores delay correlations between two successive stages on a single path. Other embodiments of this disclosure can incorporate these stage delay correlations.

Various embodiments of this disclosure could be implemented in hardware, software, firmware, or a combination thereof. Also, the instructions for implementing methods described in this disclosure could be stored in one or more memories accessible to a processor, and the processor can execute some or all of the instructions to implement various embodiments of this disclosure.

FIG. 7 is a flowchart describing one method 200 of analyzing timing uncertainty. The method begins at step 210, where an approximate model of circuit elements outside a window is created. At step 220, an accurate model of circuit elements within the window is created. The accurate model can also include a model of each mesh and buffer and each wire within the window. Both models can also model parameters affecting the operation of the mesh circuit, such as temperature and supply voltage. At step 230, Monte Carlo simulations are performed on the combination of the approximate model and the more accurate model. At step 240, an uncertainty is determined based at least in part on the Monte Carlo simulations. One method of determining the timing uncertainty comprises determining a first timing value associated with a drive signal, determining a second timing value associated with a drive signal, and then determining the timing uncertainty based at least in part on the first and second timing values.

FIG. 8 is a flowchart describing a method 300 of analyzing timing uncertainty. At step 310, a mesh circuit is modeled using a sliding window scheme. One technique for using a sliding window scheme comprises creating an approximate model of circuit elements outside of window 19 in FIG. 1, and creating a more accurate model of circuit elements inside window 19. At step 320, timing values of a portion of the mesh circuit are determined by performing Monte Carlo simulations on the sliding window scheme model. One method of performing this step is to perform the simulation over a subset of the mesh circuit covered by a first window 19 to determine a first timing value, and then sliding the window 19 to cover a second subset of the mesh circuit. An approximate model and a more accurate model are again created based on the new location of the window 19, and more Monte Carlo simulations are performed to determine a second timing value. At step 330 the method determines an uncertainty based at least in part on the plurality of the timing values.

FIG. 9 is a flowchart describing a method 400 of determining timing uncertainty associated with a drive circuit driving a mesh circuit. The method begins at step 410, where a model of the drive circuit is created, with at least one source and a plurality of sinks. At step 420, a set of sink timing values are computed by using variations of one or more parameters potentially affecting the model of the drive circuit. This can be done, for instance, either by performing a plurality of Monte Carlo simulations on the model of the drive circuit by varying one or more parameters potentially affecting the model of the drive circuit, or by applying a statistical timing analysis technique. In step 430, a model of the mesh circuit is created with at least one mesh buffer coupled to each tree sink and one or more circuit elements coupled to each of the mesh buffers. At step 440 Monte Carlo simulations are performed on the model of the mesh circuit to determine timing values of the drive signal at each circuit element. The sink timing values generated from the simulations of the tree circuit can be used in the simulations performed on the model of the mesh circuit as inputs to the mesh buffers that are coupled to each tree sink. Finally, in step 450 the method determines timing uncertainty associated with the circuit elements using the results of the simulation of the model of the mesh circuit.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of determining an uncertainty associated with at least a portion of a mesh circuit, comprising:
   (a) creating an approximate model of one or more circuit elements of a mesh circuit residing outside a window that covers a subset of the mesh circuit;
   (b) creating a more accurate model of one or more circuit elements of the mesh circuit residing within the window, wherein creating the more accurate model, includes creating a model of a drive circuit comprising a source and a plurality of sinks; computing a set of sink timing values for a drive signal arriving at the respective drive circuit sink by using variations of one or more parameters potentially affecting the model of the drive circuit;
   (c) performing a plurality of Monte Carlo simulations on the mesh circuit represented by the combination of the more accurate model of one or more circuit elements residing within the window and the approximate model of one or more circuit elements residing outside the window respective circuit elements, wherein the sink timing values of the drive circuit are used in at least one of the plurality of simulations of the mesh circuit as inputs to the mesh buffers coupled to the respective drive circuit sinks; and (d) determining an uncertainty associated with at least a portion of the mesh circuit based at least in part on results obtained from the plurality of Monte Carlo simulations on the mesh circuit.

2. The method of claim 1, wherein creating the more accurate model comprises creating a SPICE model of the one or more circuit elements residing within the window.

3. The method of claim 1, wherein the more accurate model accounts individually for each of the one or more circuit elements of the mesh circuit residing within the window.

4. The method of claim 1, wherein the mesh circuit comprises a plurality of wires and a plurality of mesh buffers, wherein each mesh buffer is operable to deliver to at least one of the plurality of wires a drive signal.

5. The method of claim 4, wherein the more accurate model of the one or more circuit elements within the window comprises a model of each mesh buffer and each wire within the window.

6. The method of claim 4, wherein the approximate model of the one or more circuit elements outside the window comprises a model of each mesh buffer and each wire outside the window.

7. The method of claim 5, wherein the more accurate model of the one or more circuit elements within the window comprises a model of one or more parameters potentially affecting the operation of the mesh circuit.

8. The method of claim 5, wherein the more accurate model of the one or more circuit elements within the window and the approximate model of one or more circuit elements outside the window comprise a model of one or more parameters potentially affecting the operation of the mesh circuit.

9. The method of claim 7, wherein the one or more parameters potentially affecting the operation of the mesh circuit comprises a parameter selected from a group consisting of a temperature, a supply voltage, a transistor channel length, a transistor threshold voltage, an interconnect width, an interconnect thickness, a cross-talk noise, and a Phase Locked Loop jitter.

10. The method of claim 8, wherein the one or more parameters potentially affecting the operation of the mesh circuit comprises a parameter selected from a group consisting of a temperature, a supply voltage, a transistor channel length, a transistor threshold voltage, an interconnect width, an interconnect thickness, a cross-talk noise, and a Phase Locked Loop jitter.

11. The method of claim 7, wherein each of the one or more circuit elements of the more accurate model comprises one or more parameters that can be set independently of parameters of others of the one or more circuit elements of the more accurate model during each Monte Carlo simulation.

12. The method of claim 11, wherein each of the one or more circuit elements of the approximate model comprises one or more parameters that can be set independently of parameters of others of the one or more circuit elements of the more accurate model during each Monte Carlo simulation.

13. The method of claim 1, wherein at least two of the plurality of Monte Carlo simulations comprise simulating the mesh circuit represented by the combination of the more accurate model of one or more circuit elements residing within the window and the approximate model of one or more circuit elements residing outside the window using different values for at least one parameter potentially affecting the operation of the mesh circuit.

14. The method of claim 7, wherein determining the uncertainty of at least a portion of the mesh circuit comprises:
determining a first timing value associated with at least one of the drive signals and a first value of one of the one or more parameter values;
determining a second timing value associated with the at least one of the drive signals and a second value of the one of the one or more parameter values; and
determining an uncertainty based at least in part on the first and second timing values.

15. The method of claim 14, wherein at least one of the first or the second timing values comprises a signal arrival time at a circuit element in the mesh circuit or a skew value of a signal at two different elements of the mesh circuit.

16. The method of claim 1, wherein creating the approximate model comprises modeling a first plurality of actual circuit elements as a second plurality of modeled circuit elements, wherein the first plurality is greater than the second plurality.

17. The method of claim 1, wherein the subset of the mesh circuit comprises a first subset of the mesh circuit, and further comprising:
sliding the window to cover a second subset of the mesh circuit; and
performing steps (a)-(d) based on position of the window covering the second subset of the mesh circuit.

18. The method of claim 17, further comprising determining an uncertainty of the at least a portion of the mesh circuit based at least in part on an uncertainty calculated based on the window covering the first subset of the mesh circuit or an uncertainty calculated based on the window covering the second subset of the mesh circuit.

19. The method of claim 18, wherein the uncertainty of the at least a portion of the mesh circuit comprises an uncertainty associated with the entire mesh circuit.

20. A method of determining a timing value uncertainty associated with at least a portion of a mesh circuit, comprising:
(a) modeling a mesh circuit using a sliding window scheme to create a sliding window scheme model of the mesh circuit wherein the model, includes a model of a drive circuit comprising a source and a plurality of sinks; computing a set of sink timing values for a drive signal arriving at the respective drive circuit sink by using variations of one or more parameters potentially affecting the model of the drive circuit; performing a plurality of Monte Carlo simulations on the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive circuit sinks;
(b) determining a plurality of timing values associated with the at least a portion of the mesh circuit by performing a plurality of Monte Carlo simulations on the sliding window scheme model of the mesh circuit; and
(c) determining a timing value uncertainty associated with the at least a portion of the mesh circuit based at least in part on the plurality of timing values.

21. The method of claim 20, wherein the plurality of timing values comprise a signal arrival time at a circuit element in the mesh circuit or a skew value of a signal at two different elements of the mesh circuit.

22. The method of claim 20 wherein modeling a mesh circuit using a sliding window scheme comprises:
(a) creating an approximate model of one or more circuit elements of a mesh circuit residing outside a window that covers a subset of the mesh circuit;
(b) creating a more accurate model of one or more circuit elements of the mesh circuit residing within the window.

23. The method of claim 20, wherein the mesh circuit comprises a plurality of wires and a plurality of mesh buffers, wherein each mesh buffer is operable to deliver to at least one of the plurality of wires a drive signal.

24. The method of claim 22, wherein the more accurate model of the one or more circuit elements within the window comprises a model of one or more parameters potentially affecting the operation of the mesh circuit.

25. The method of claim 24, wherein the one or more parameters potentially affecting the operation of the mesh circuit comprises a parameter selected from a group consisting of a temperature, a supply voltage, a transistor channel length, a transistor threshold voltage, an interconnect width, an interconnect thickness, a cross-talk noise, and a Phase Locked Loop jitter.

26. The method of claim 20, wherein at least two of the plurality of Monte Carlo simulations comprise simulating the mesh circuit represented by the combination of the more accurate model of one or more circuit elements residing within the window and the approximate model of one or more circuit elements residing outside the window using different values for at least one parameter potentially affecting the operation of the mesh circuit.

27. The method of claim 25, wherein determining the timing value uncertainty of at least a portion of the mesh circuit comprises:
determining a first timing value associated with at least one of the drive signals and a first value of one of the one or more parameter values;
determining a second timing value associated with the at least one of the drive signals and a second value of the one of the one or more parameter values; and
determining a timing value uncertainty based at least in part on the first and second timing values.

28. The method of claim 22, wherein the subset of the mesh circuit comprises a first subset of the mesh circuit, and further comprising:
sliding the window to cover a second subset of the mesh circuit; and
performing steps (a)-(c) based on position of the window covering the second subset of the mesh circuit.

29. The method of claim 28, further comprising determining a timing value uncertainty of the at least a portion of the mesh circuit based at least in part on a timing value uncertainty calculated based on the window covering the first subset of the mesh circuit and a timing value uncertainty calculated based on the window covering the second subset of the mesh circuit.

30. The method of claim 29, wherein the timing value uncertainty of the at least a portion of the mesh circuit comprises a timing value uncertainty associated with the entire mesh circuit.

31. A method of determining a timing value uncertainty associated with a clock signal in a mesh circuit, comprising:
(a) creating an approximate model of one or more circuit elements of a mesh circuit residing outside a window that covers a subset of the mesh circuit;
(b) creating a more accurate model of one or more circuit elements of the mesh circuit residing within the window, wherein creating the more accurate model, includes creating a model of a drive circuit comprising a source and a plurality of sinks; computing a set of sink timing values for a drive signal arriving at the respective drive circuit sink by using variations of one or more parameters potentially affecting the model of the drive circuit;
(c) performing a plurality of Monte Carlo simulations on the combination of the more accurate model and the approximate model to determine a plurality of timing values, wherein each run of the Monte Carlo simulation varies one or more parameters potentially affecting the operation of the mesh circuit respective circuit elements, wherein the sink timing values of the drive circuit are used in at least one of the plurality of simulations of the mesh circuit as inputs to the mesh buffers coupled to the respective drive circuit sinks; and
(d) determining a timing value uncertainty associated with the clock signal in at least a portion of the mesh circuit based at least in part on the plurality of timing values.

32. The method of claim 31, wherein the one or more parameters potentially affecting the operation of the mesh circuit comprises a parameter selected from a group consisting of a temperature, a supply voltage, a transistor channel length, a transistor threshold voltage, an interconnect width, an interconnect thickness, a cross-talk noise, and a Phase Locked Loop jitter.

33. The method of claim 31, wherein the mesh circuit comprises a plurality of wires and a plurality of mesh buffers, wherein each mesh buffer is operable to deliver to at least one of the plurality of wires a drive signal.

34. The method of claim 33, wherein determining the timing value uncertainty of at least a portion of the mesh circuit comprises:
determining a first timing value associated with at least one of the drive signals and a first value of one of the one or more parameter values;
determining a second timing value associated with the at least one of the drive signals and a second value of the one of the one or more parameter values; and
determining a timing value uncertainty based at least in part on the first and second timing values.

35. The method of claim 34, wherein at least one of the first or the second timing values comprises a clock signal arrival time at a circuit element in the mesh circuit or a skew value of a clock signal at two different elements of the mesh circuit.

36. The method of claim 31, wherein the size of the window is selected as a function of the size of the entire mesh model.

37. The method of claim 31, wherein the window has a border of a fixed width.

38. The method of claim 31, wherein the circuit elements include wires, buffers, and sequential circuit elements.

39. A method of determining a timing value uncertainty associated with at least a portion of a circuit that includes a drive circuit driving a mesh circuit, the method comprising:
creating a model of a drive circuit comprising at least one source and a plurality of sinks;
computing a set of sink timing values for a drive signal arriving at the respective drive circuit sink by using variations of one or more parameters potentially affecting the model of the drive circuit;
creating a model of a mesh circuit driven by the drive circuit, wherein the mesh circuit comprises at least one mesh buffer coupled to each of the plurality of drive circuit sinks and one or more circuit elements coupled to each of the mesh buffers;
performing a plurality of Monte Carlo simulations on the model of the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive circuit sinks; and determining a timing value uncertainty associated with at least some of the one or more circuit elements based at least in part on the results of the simulations of the model of the mesh circuit.

40. The method of claim 39, wherein the circuit elements include wires, buffers, and sequential circuit elements.

41. The method of claim 39, wherein the one or more parameters potentially affecting the operation of the drive circuit comprises a parameter selected from a group consisting of a temperature, a supply voltage, a transistor channel length, a transistor threshold voltage, an interconnect width, an interconnect thickness, a cross-talk noise, and a Phase Locked Loop jitter.

42. The method of claim 39, wherein creating a model of a mesh circuit driven by the drive circuit comprises:
   creating an approximate model of one or more circuit elements of a mesh circuit residing outside a window that covers a subset of the mesh circuit; and
   creating a more accurate model of one or more circuit elements of the mesh circuit residing within the window.

43. The method of claim 39, wherein determining a timing value uncertainty associated with at least some of one or more circuit elements comprises:
   modeling a mesh circuit using a sliding window scheme to create a sliding window scheme model of the mesh circuit;
   determining a plurality of timing values associated with the at least a portion of the mesh circuit by performing a plurality of Monte Carlo simulations on the sliding window scheme model of the mesh circuit; and
   determining a timing value uncertainty associated with the at least a portion of the mesh circuit based at least in part on the plurality of timing values.

44. The method of claim 39, wherein the more accurate model accounts individually for each of the one or more circuit elements of the mesh circuit residing within the window.

45. The method of claim 39, wherein creating the approximate model comprises modeling a first plurality of actual circuit elements as a second plurality of modeled circuit elements, wherein the first plurality is greater than the second plurality.

46. The method of claim 39, wherein the drive circuit operates to drive a plurality of mesh circuits.

47. The method of claim 39, wherein the drive circuit comprises a tree circuit.

48. The method of claim 39, wherein a set of sink timing values are computed either by performing a plurality of Monte Carlo simulations on the model of the drive circuit by varying one or more parameters potentially affecting the model of the drive circuit or by a statistical timing analysis technique.

49. Logic encoded in one or more tangible media for execution and when executed operable to:
   (a) create an approximate model of one or more circuit elements of a mesh circuit residing outside a window that covers a subset of the mesh circuit;
   (b) create a more accurate model of one or more circuit elements of the mesh circuit residing within the window, wherein creating the more accurate model, includes creating a model of a drive circuit comprising a source and a plurality of sinks; computing a set of sink timing values for a drive signal arriving at the respective drive circuit sink by using variations of one or more parameters potentially affecting the model of the drive circuit;
   (c) perform a plurality of Monte Carlo simulations on the mesh circuit represented by the combination of the more accurate model of one or more circuit elements residing within the window and the approximate model of one or more circuit elements residing outside the window respective circuit elements, wherein the sink timing values of the drive circuit are used in at least one of the plurality of simulations of the mesh circuit as inputs to the mesh buffers coupled to the respective drive circuit sinks; and
   (d) determine an uncertainty associated with at least a portion of the mesh circuit based at least in part on results obtained from the plurality of Monte Carlo simulations on the mesh circuit.

50. Logic encoded in one or more tangible media for execution and when executed operable to:
   (a) model a mesh circuit using a sliding window scheme to create a sliding window scheme model of the mesh circuit wherein the model, includes a model of a drive circuit comprising a source and a plurality of sinks; computing a set of sink timing values for a drive signal arriving at the respective drive circuit sink by using variations of one or more parameters potentially affecting the model of the drive circuit; performing a plurality of Monte Carlo simulations on the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive circuit sinks;
   (b) determine a plurality of timing values associated with the at least a portion of the mesh circuit by performing a plurality of Monte Carlo simulations on the sliding window scheme model of the mesh circuit; and
   (c) determine a timing value uncertainty associated with the at least a portion of the mesh circuit based at least in part on the plurality of timing values.

51. Logic encoded in one or more tangible media for execution and when executed operable to:
   create a model of a drive circuit comprising at least one source and a plurality of sinks;
   compute a set of sink timing values for a drive signal arriving at the respective drive circuit sink by using variations of one or more parameters potentially affecting the model of the drive circuit;
   create a model of a mesh circuit driven by the drive circuit, wherein the mesh circuit comprises at least one mesh buffer coupled to each of the plurality of drive circuit sinks and one or more circuit elements coupled to each of the mesh buffers;
   perform a plurality of Monte Carlo simulations on the model of the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive circuit sinks; and
   determine a timing value uncertainty associated with at least some of the one or more circuit elements based at least in part on the results of the simulations of the model of the mesh circuit.

52. An apparatus comprising:
one or more processors; and
a memory coupled to the processors comprising one or more instructions, the processors operable when executing the instructions to:
  (a) create an approximate model of one or more circuit elements of a mesh circuit residing outside a window that covers a subset of the mesh circuit;
  (b) create a more accurate model of one or more circuit elements of the mesh circuit residing within the window, wherein creating the more accurate model, includes creating a model of a drive circuit comprising a source and a plurality of sinks; computing a set of sink timing values for a drive signal arriving at the respective drive circuit sink by using variations of one or more parameters potentially affecting the model of the drive circuit;
  (c) perform a plurality of Monte Carlo simulations on the mesh circuit represented by the combination of the more accurate model of one or more circuit elements residing within the window and the approximate model of one or more circuit elements residing outside the window respective circuit elements, wherein the sink timing values of the drive circuit are used in at least one of the plurality of simulations of the mesh circuit as inputs to the mesh buffers coupled to the respective drive circuit sinks; and
  (d) determine an uncertainty associated with at least a portion of the mesh circuit based at least in part on results obtained from the plurality of Monte Carlo simulations on the mesh circuit.

53. An apparatus comprising:
one or more processors; and
a memory coupled to the processors comprising one or more instructions, the processors operable when executing the instructions to:
  (a) model a mesh circuit using a sliding window scheme to create a sliding window scheme model of the mesh circuit wherein the model, includes a model of a drive circuit comprising a source and a plurality of sinks; computing a set of sink timing values for a drive signal arriving at the respective drive circuit sink by using variations of one or more parameters potentially affecting the model of the drive circuit; performing a plurality of Monte Carlo simulations on the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive circuit sinks;
  (b) determine a plurality of timing values associated with the at least a portion of the mesh circuit by performing a plurality of Monte Carlo simulations on the sliding window scheme model of the mesh circuit; and
  (c) determine a timing value uncertainty associated with the at least a portion of the mesh circuit based at least in part on the plurality of timing values.

54. An apparatus comprising:
one or more processors; and
a memory coupled to the processors comprising one or more instructions, the processors operable when executing the instructions to:
  create a model of a drive circuit comprising at least one source and a plurality of sinks;
  compute a set of sink timing values for a drive signal arriving at the respective drive circuit sink by using variations of one or more parameters potentially affecting the model of the drive circuit;
  create a model of a mesh circuit driven by the drive circuit, wherein the mesh circuit comprises at least one mesh buffer coupled to each of the plurality of drive circuit sinks and one or more circuit elements coupled to each of the mesh buffers;
  perform a plurality of Monte Carlo simulations on the model of the mesh circuit to determine, for each simulation, a circuit element timing value of a drive signal at each of the respective circuit elements, wherein the sink timing values of the drive circuit are used in at least one of the plurality of simulations of the mesh circuit as inputs to the mesh buffers coupled to the respective drive sinks; and
  determine a timing value uncertainty associated with at least some of the one or more circuit elements based at least in part on the results of the simulations of the model of the mesh circuit.

* * * * *